(12) United States Patent
Liu et al.

(10) Patent No.: US 10,140,410 B1
(45) Date of Patent: Nov. 27, 2018

(54) REPRESENTING A ROUTING STRIP IN AN INTEGRATED CIRCUIT DESIGN USING A DIGIT PATTERN

(71) Applicant: Cadence Design Systems, Inc., San Jose, CA (US)

(72) Inventors: An Liu, Shanghai (CN); Xiang Gao, Shanghai (CN); Ming Chen, Shanghai (CN); Yan Zhao, Shanghai (CN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 109 days.

(21) Appl. No.: 15/349,873

(22) Filed: Nov. 11, 2016

(51) Int. Cl.
*G06F 17/50* (2006.01)

(52) U.S. Cl.
CPC .................. *G06F 17/5077* (2013.01)

(58) Field of Classification Search
CPC .................................................. G06F 17/5081
USPC .......................................................... 716/139
See application file for complete search history.

(56) References Cited

U.S. PATENT DOCUMENTS

| | | | |
|---|---|---|---|
| 7,334,208 B1* | 2/2008 | Cox | G06F 17/5081 716/129 |
| 7,979,983 B2* | 7/2011 | Bird et al. | H05K 1/113 174/262 |
| 8,438,531 B2 | 5/2013 | Majumder et al. | |
| 8,645,901 B2 | 2/2014 | Majumder et al. | |
| 9,026,978 B1 | 5/2015 | Liu et al. | |
| 9,165,104 B1 | 10/2015 | Wang | |
| 9,202,006 B1 | 12/2015 | Bhattacharya et al. | |
| 9,305,133 B1 | 4/2016 | Ghosh et al. | |
| 2015/0256397 A1* | 9/2015 | Agarwal | H04L 41/12 370/254 |

* cited by examiner

*Primary Examiner* — Sun Lin
(74) *Attorney, Agent, or Firm* — Foley & Lardner LLP (57) ABSTRACT

Embodiments disclosed herein provide techniques for representing a routing strip in an integrated circuit design using a digit pattern. According to certain aspects, the techniques include methods to display overlapped routing strips of an integrated circuit design when there are ten or more metal layers in the integrated circuit design. According to additional or alternative aspects, the techniques include methods to generate a texture pattern for displaying routing strips in which layer identification and layer direction of each routing strip can be easily discerned. According to further additional or alternative aspects, the techniques include methods to cause texture patterns for displaying routing strips to stagger with respect to each other when the routing strips are overlapped in a display.

16 Claims, 7 Drawing Sheets

REPRESENTING A ROUTING STRIP IN AN INTEGRATED CIRCUIT DESIGN USING A DIGIT PATTERN

TECHNICAL FIELD

Embodiments disclosed herein relate generally to designing integrated circuits, and more particularly to techniques for representing a routing strip in an integrated circuit design using a digit pattern.

BACKGROUND

Designing an integrated circuit (IC) has been made considerably easier by the availability of electronic design automation (EDA) tools. An IC can include billions of devices, and can comprise ten to sixteen layers or more of conductor material. EDA tools allow a designer to describe an integrated circuit based on its desired behavior, and then transform that behavioral description into a set of geometric shapes corresponding to the devices for each of the layers, the set of shapes being called a layout. Included among the stages of designing an IC, devices are placed into a floor plan. The devices are then interconnected together with wires, busses, etc. made of a conductor material.

It is often desirable during many stages of an IC design and verification process to visualize how devices and wires are actually laid out in the various layers of the IC. Many EDA tools include a graphical user interface (GUI) for allowing a designer to do this. However, in designs with ten or more layers, and billions of devices and wires, many challenges can arise when a GUI is trying to display portions of designs with devices and wires overlapping each other at many points in the various layers.

SUMMARY

Embodiments disclosed herein provide techniques for representing a routing strip in an integrated circuit design using a digit pattern. According to certain aspects, the techniques include methods to display overlapped routing strips of an integrated circuit design when there are ten or more metal layers in the integrated circuit. According to additional or alternative aspects, the techniques include methods to generate a texture pattern for displaying routing strips in which the layer identification and layer direction can be easily discerned. According to further additional or alternative aspects, the techniques include methods to cause texture patterns for displaying routing strips to stagger with respect to each other when the routing strips are overlapped in a display.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION OF THE PREFERRED EMBODIMENTS

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to some aspects, embodiments described herein provide a method to display overlapped routing strips when there are a large number (e.g. ten or more) metal layers in an integrated circuit design.

Figure 1:
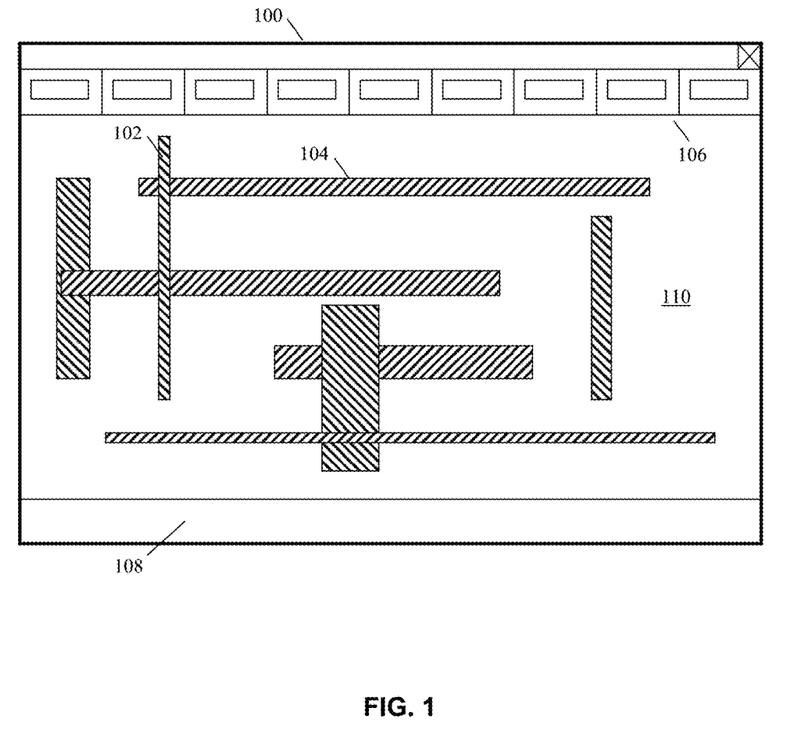
FIG. 1 is a diagram illustrating aspects of an example user interface for displaying routing strips having texture patterns.

FIG. 1 is a diagram illustrating example aspects of the present embodiments. As shown in FIG. 1, a GUI 100 displays a plurality of shapes in an IC design. These shapes can include shapes in the design corresponding to portions of devices, wires, interconnections, busses, vias, etc. For ease of illustration, FIG. 1 only illustrates shapes corresponding to wires, interconnections, busses (e.g. power/ground), etc. (hereinafter referred to collectively as "routing strips"). Those skilled in the art will appreciate that a typical GUI of an EDA tool can display many other types of shapes associated with a particular integrated circuit design.

In an IC, layers are typically numbered in ascending order from the bottom layer to the top layer (e.g., Metal 1, Metal 2, Metal 3, etc.). Any layer has an adjacent upper and a lower layer, except the bottom layer which has only an adjacent upper layer, and the top layer which has only an adjacent lower layer. In many ICs, routing strips in adjacent layers are routed in perpendicular directions. For example, as shown in FIG. 1, routing strip 102 in an upper layer L is routed in a vertical or north-south direction, while routing strip 104 in an adjacent lower layer L-1 is routed in a horizontal or east-west direction.

As can be seen in FIG. 1, in conventional GUI's that allow for shapes in some or all layers to be viewed at the same time, the routing strips can overlap each other, with some routing strips being considerably obscured from view, and the actual layers in which routing strips lie being difficult to determine. This problem can become more acute when a user "zooms in" to view shapes more closely.

To overcome these challenges, the present applicants have identified a number of techniques that can be employed.

For example, some conventional GUI's allow a given layer of the IC to be selected as a current or "working" layer, with shapes of the current or "working" layer being displayed more visibly than shapes in other layers. For example, GUI 100 includes controls 106, including one or more controls that allow a user to select a given layer (e.g., via an on/off checkbox or similar GUI mechanism for each of the layers) for visibility and/or selectability for editing. In these and other examples, GUI 100 includes a legend area 108 (either continuously displayed or displayed via a user selection) that displays information such as the current selected layer, the coordinates of the portion of the IC design that is being displayed, among other things.

Relatedly, in some conventional GUI's, to further help distinguish between and identify routing strips, the routing strips that are in layers routed in the same direction are given the same fill pattern or "texture pattern". For example, as shown in FIG. 1, routing strip 102 and all other routing strips being routed in the vertical or north-south direction are given a "backslash" oriented texture pattern, while routing strip 104 and all other routing strips being routed in the horizontal or east-west direction are given a "slash" oriented texture pattern.

Still further, in some conventional GUI's, to visually distinguish between layers in which routing strips lie, the routing strips lying in each layer are all assigned the same color (i.e. the color of their outlines and texture pattern), with different colors being assigned to each different layer.

It should be noted that the example GUI shown in FIG. 1 has been greatly simplified to illustrate aspects of the present embodiments. It should be apparent to those skilled in the art can include many other elements, such as drop down lists, controls, pop-up windows and the like.

The present applicants recognize many drawbacks of the conventional approaches such as those illustrated in connection with FIG. 1. For example, in designs including ten or more layers, it is hard to find a set of colors with significant differences between them to so as to easily distinguish between the layers. It is also difficult for a user to keep so many relationships between colors and metal layers in mind, with the result being that they have to switch between viewing the canvas portion 110 of the display and the legend 108 frequently. Still further, in example GUIs having on/off checkboxes for viewing one or more layers among 16 or more layers, it is difficult for a user to decide which layers should be turned on/off from the display of shapes themselves.

According to some aspects, embodiments described herein provide ways to overcome these and other drawbacks. In some embodiments, a method for displaying routing strips for IC designs having a large number of metal layers (e.g. ten or more) includes generating a texture pattern that visually combines the layer number identification and layer direction. In these and other embodiments, the method includes causing the patterns to stagger with respect to each other when routing strips in two or more metal layers are overlapped with each other in a display.

Figure 2:
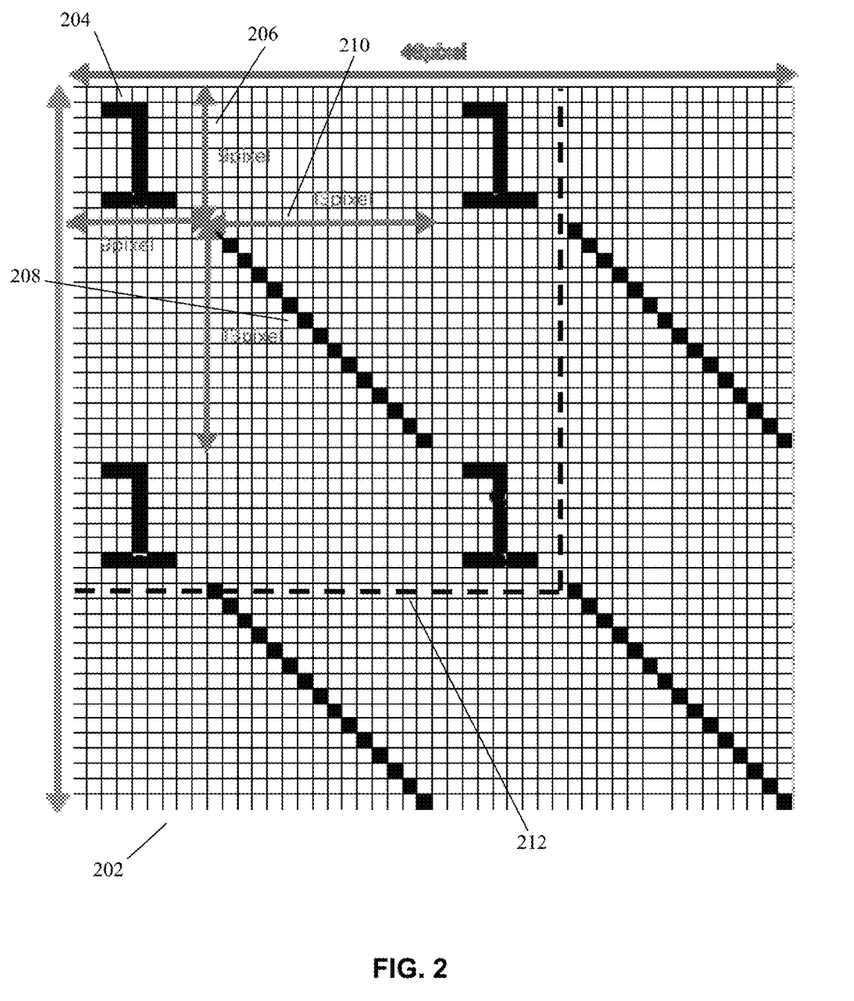
FIG. 2 illustrates aspects of an example digit pattern according to embodiments.

FIG. 2 illustrates aspects of example "digit" texture patterns (i.e. digit patterns) according to embodiments. In this example, the digit pattern is comprised of repeating blocks 202, each having a width and height of 48 pixels. Inside block 202, the digit 204 is drawn in a 9×9 pixel box 206, the digit 204 representing the metal layer id (the metal layer is Metal 1 in this example). Example block 202 further includes a slash or backslash line 208 (depending on the routing direction of lines in the associated metal layer) in a 15×15 pixel box 210 to represent the direction of the routing strip. So altogether in block 202 there is a 33×33 pixel unit 212 which includes 4 digits at each of the four corners and a slash line in the center. According to certain additional or alternative aspects to be described below, this unit 212 can be shifted around inside the 48×48 pixel block 202 so that the digits of routing strips that are overlapping in different layers of the IC are not also overlapped with each other.

It should be apparent that the pixel sizes provided in the above example are just one possible example, and that many variations of both overall, digit and other sizes are possible. Moreover, it should be further apparent that, although not shown in FIG. 2 for purposes of clarity of the invention, in some embodiments the color of the digits 204 and slashes 208, as well as the orientation of slashes 208 (i.e. forward or backward slash) in the digit pattern for each layer can be different.

Figure 3:
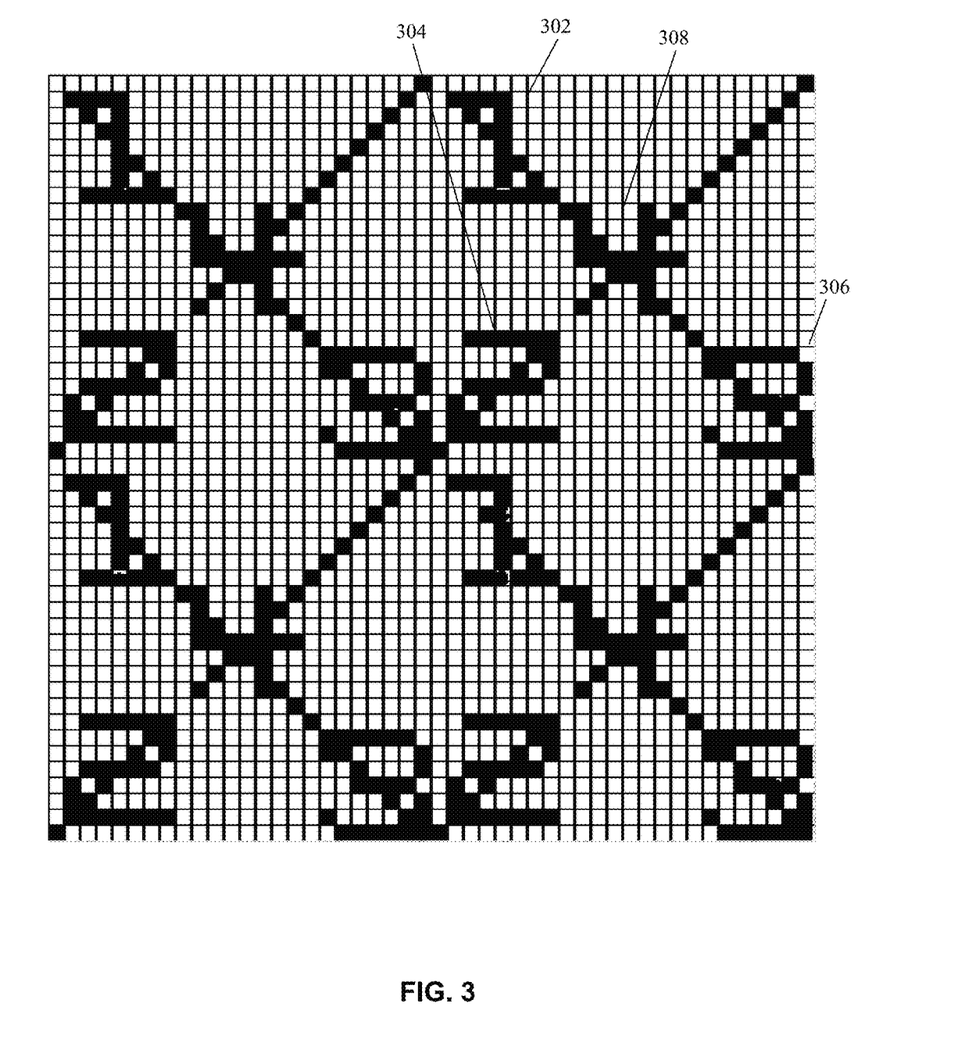
FIG. 3 illustrates additional aspects of overlapping digit patterns according to embodiments.

FIG. 3 illustrates example aspects of overlapping digit patterns according to embodiments. In the example shown in FIG. 3, the digit patterns for routing strips in metal layers Metal 1 to Metal 4 are overlapped with each other. However, according to certain aspects of these embodiments, the digits 302, 304, 306 and 308 in the patterns for layers Metal 1, Metal 2, Metal 3 and Metal 4, respectively, are all shifted with respect to each other such that no digit overlaps any other digit even when routing strips in these layers all overlap with each other in one displayed portion of an IC design.

According to certain aspects of these and other embodiments, the present applicants recognize that the density of routing strips in IC designs is often higher in the lower level metal layers (e.g. from the first layer to the fourth layer). Accordingly, in some embodiments, the digits in the patterns are shifted as much as possible with respect to each other so as to safely cause the digits for these layers to not overlap with each other. Meanwhile, for higher metal layers, the digits in patterns for routing strips in adjacent layers may not be shifted as much with respect to each other, given the lower density and reduced risks of overlapping displays of routing strips. Rather, an aspect of some embodiments is to shift digits in patterns as much as possible with respect to each other for routing strips in higher metal layers with the same routing direction (e.g. vertical or horizontal).

Figure 4:
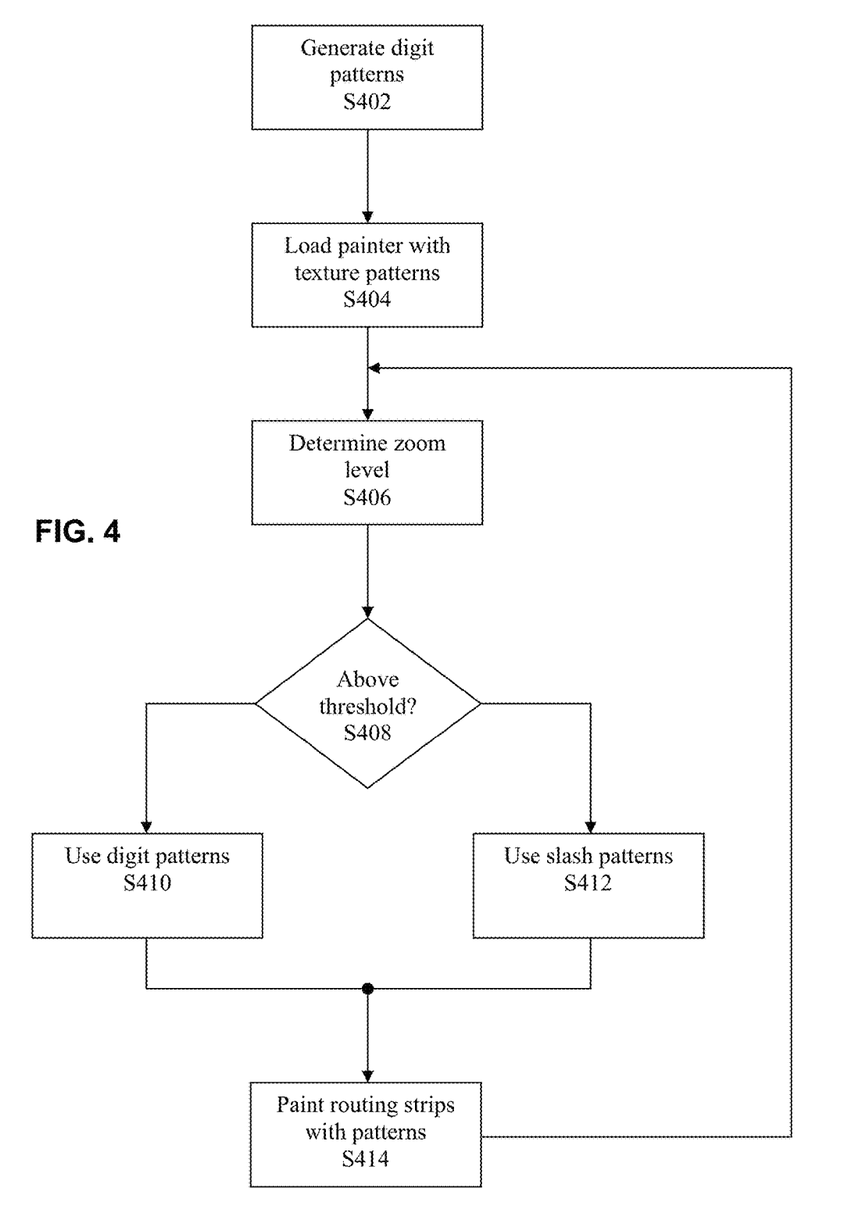
FIG. 4 is a flowchart illustrating an example digit pattern methodology according to embodiments.

FIG. 4 is a flowchart illustrating an example digit pattern methodology according to the above-described and other embodiments.

First, in step S402, the digit patterns for routing strips in all layers are created. As set forth in the example described in connection with FIG. 2, the digit pattern for each layer is comprised of a repeating 48×48 pixel box. A digit representing the metal layer ID (e.g. the digit "1" for metal layer Metal 1) is drawn in a 9×9 pixel box and a slash or backslash line (depending on the routing direction of the layer) is drawn in a 15×15 pixel box to represent the direction of the routing strip. So there is a 33×33 pixel unit which includes four digits at the four corners and a slash line in the center.

As further set forth above in connection with FIG. 3, in some embodiments, the 33×33 pixel unit having the four digits and slash line is shifted around differently inside the 48×48 pixel box for each layer so that the digits for adjacent layers will not overlap with each other. As further set forth above, in these and other embodiments, the 33×33 pixel units for adjacent lower metal layers may be shifted more substantially with respect to each other than the 33×33 pixel units for higher metal layers.

In some embodiments, the digit patterns are saved in a set of monochrome X BitMap (XBM) files, one file for each layer, each file having a width and height of 48 pixels. However, the principles of these and other embodiments are not limited to this example, and other open or proprietary file formats (e.g. PNG, BMP, etc.) and storage options are possible.

It should be appreciated by those skilled in the art that step S402 can be performed in a variety of different operating combinations with the remaining steps to be described below. For example, when the digit patterns are to be used in a GUI for an EDA tool, the digit patterns may not be created every time the GUI is being used to work on an IC design. Rather, step S402 may be performed in an off-line process, for example when other GUI elements such as icons and cursors and other texture patterns are being generated, and the files may be retrieved whenever the GUI is initiated. In other embodiments, step S402 may be performed whenever a new IC design is being selected, and can be performed based on the number of layers in the particular design that is selected. In yet other embodiments, step S402 the digit patterns are always pre-generated for the same number of layers (e.g. 32) regardless of the number of layers in the particular design, with additional patterns generated for a given design if needed for additional layers.

Next in step S404, after digit patterns have been created for all metal layers, they are loaded into the texture pattern painter. For example, in embodiments implemented in connection with an EDA tool, the tool can include user interface modules that interact with a user to select and adjust a display of a portion of an integrated circuit design. Such user interface modules can include many different modules for generating a display of shapes corresponding to routing strips in the integrated circuit design based on design data that is also used to implement the integrated circuit. These user interface modules can include a texture pattern painter that is called to fill the routing strips that are in the portion of the integrated circuit that is being displayed with the appropriate texture pattern, based on the metal layer in which they lie. In these and other embodiments, in user interface modules implemented using QT, the XBM files are read and the texture is set to the QPainter using the setBrush( ) API. Those skilled in the art will appreciate that there can be many other user interface modules for generating and adjusting these displays based on integrated circuit design data and user actions. However, further details thereof will be omitted here for sake of clarity of the invention.

As set forth above, the colors of the digits and slash lines for the digit patterns for each layer can be different. In these and other embodiments, these different colors are assigned in this step and also loaded into the painter. It should be noted that the painter can be further loaded with other texture patterns, such as conventional slash and backslash patterns.

In step S406, whenever the painter is needed, the current zoom level or size of routing strips being displayed is determined. For example, every time the user interacts with a GUI to cause a different portion of an integrated circuit to be displayed, or to cause the detail level of the display to increase or decrease, the contents of the display of shapes corresponding to routing strips need to be refreshed (i.e. redrawn for new sizes and locations in the display). For example, depending on the current view and detail level (and perhaps the layers that are currently selected by the user for display), the boundaries of the portion of the integrated circuit design are determined, and the associated shapes within those boundaries are identified, including an identification of the shapes associated with routing strips, their positions in the display, and the metal layers in which they lie. This information is used to redraw the shapes for the display, using any means known to those skilled in the art.

In step S408 the zoom or detail level is compared to a threshold.

Figure 6:
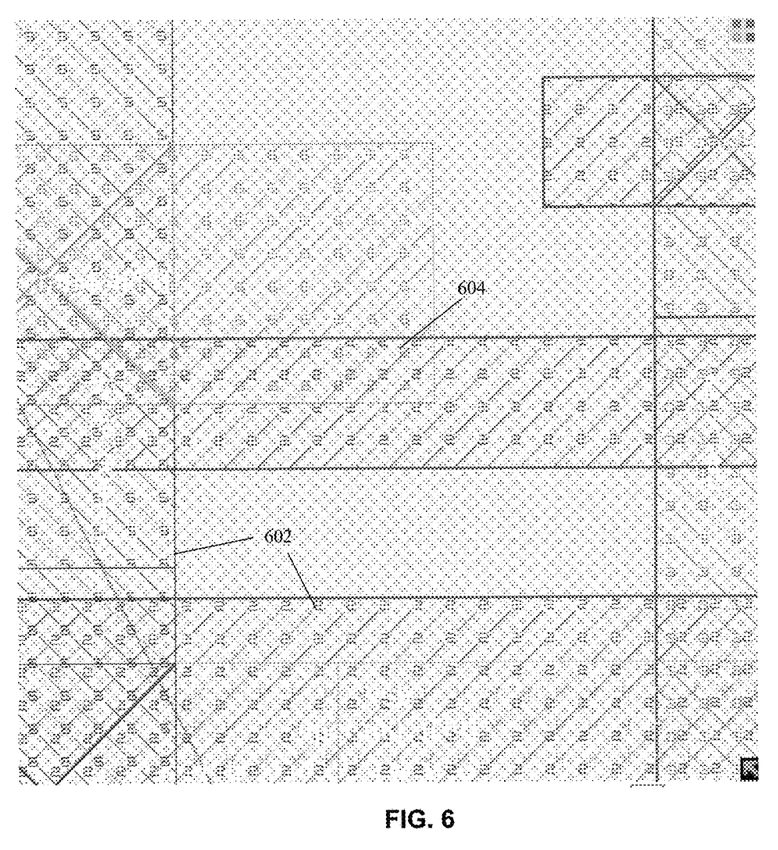
FIG. 6 is a screenshot illustrating an example display of overlapping routing strips of a portion of an integrated circuit design according to embodiments.

If it is determined in step S408 that the user has zoomed in to detail view, or the width and height of routing strip is bigger than 48 pixels (i.e. the zoom level is above the threshold), processing proceeds to step S412 where the digit patterns are selected to represent the metal later and direction. A screenshot illustrating an example display of overlapping routing strips 602 having digit patterns in accordance with these embodiments is provided in FIG. 6. According to aspects of the disclosure illustrated in FIG. 6, the digits in a common overlapping portion 604 in the display of shapes corresponding to routing strips in different layers (layers 2 and 6 in this example) are not obscured by each other.

Figure 7:
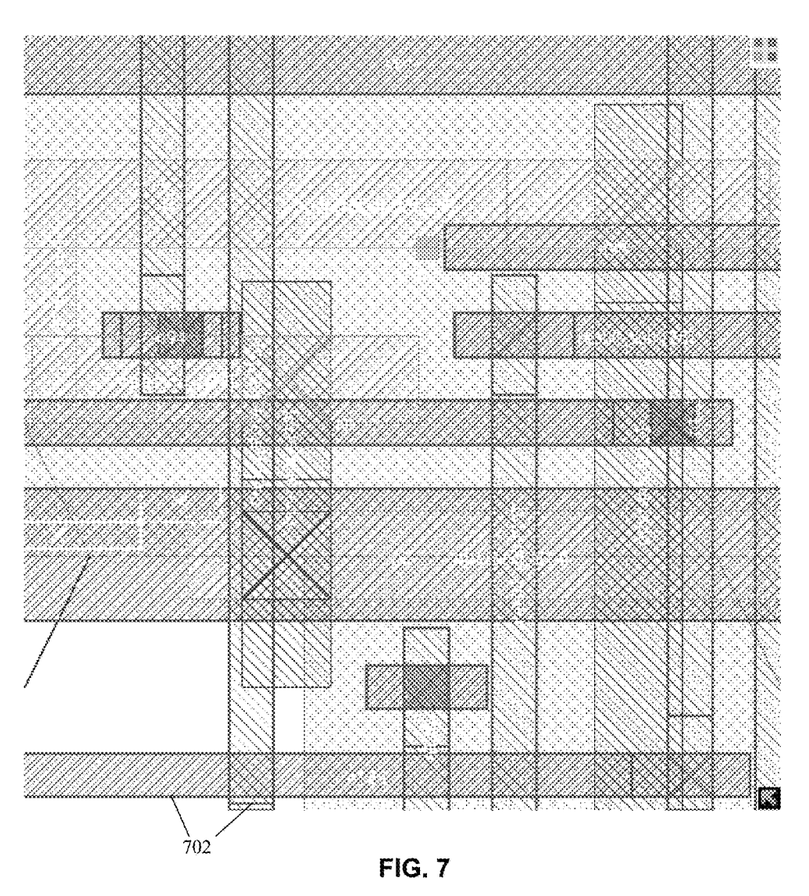
FIG. 7 is a screenshot illustrating another example display of overlapping routing strips of a portion of an integrated circuit design according to embodiments.

Otherwise, if it is determined in step S408 that the width or height of routing strips is smaller than 48 pixels (i.e. the zoom level is lower than the threshold), processing proceeds to step S410 where conventional slash and backslash patterns are selected for use by the painter. A screenshot illustrating an example display of overlapping routing strips 702 having conventional patterns in accordance with these embodiments is provided in FIG. 7.

In either event processing proceeds to S414 and the routing strips are painted with the appropriate patterns and processing returns to step S406. The above information about shapes in the current display is provided to the painter, which fills the routing strip shapes in the current display with the appropriate texture patterns. For example, starting from a common origin 0,0 (e.g. the upper left corner of the layout window, such as canvas portion 110), the painter sequences through blocks of 48×48 pixels at a time and fills in any shapes lying partially or fully in the block with the appropriate pattern and color, depending on the layer in which they lie.

Figure 5:
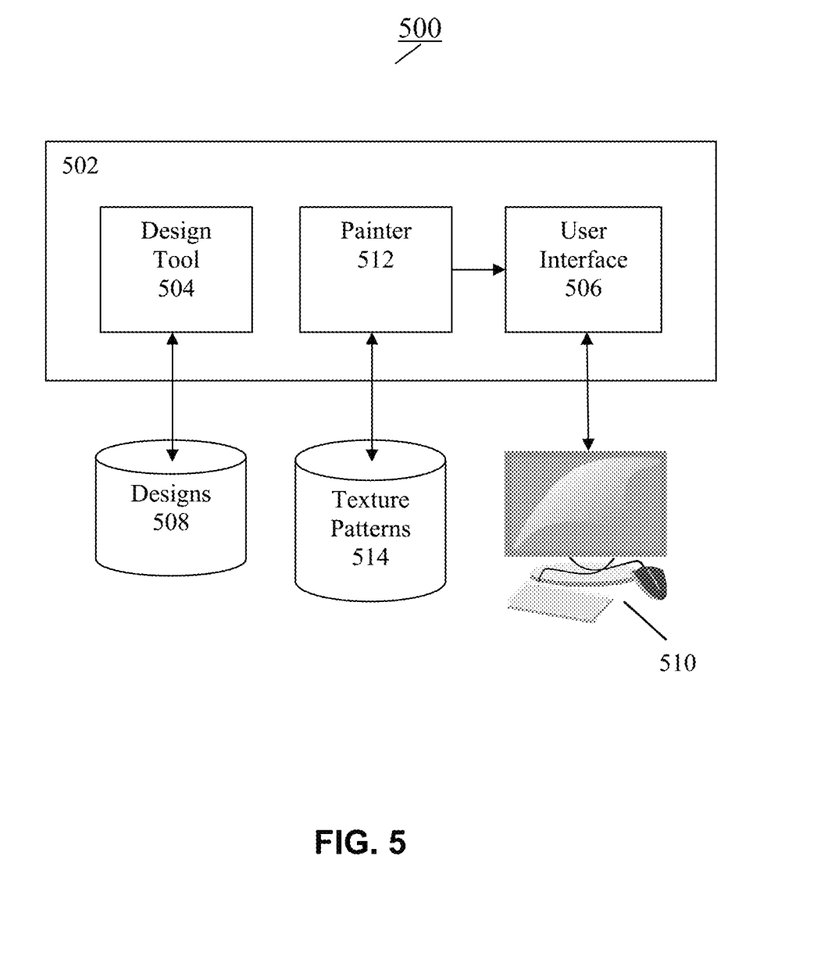
FIG. 5 is a block diagram illustrating an example system that can implement digit pattern functionality according to embodiments.

FIG. 5 is a block diagram of an example system according to the present embodiments.

As shown, the system includes an EDA tool 502 comprising a design tool 504 and user interface module 506. Design tool 504 and user interface module 506 include one or more EDA modules for assisting a user to interactively implement integrated circuit designs 508, the EDA modules being one or more of a placer, a routing engine, a design rule checker, a floorplanner, a layout editor, a power integrity signoff engine, an implementation engine, an optimization engine and/or a timing analysis and signoff engine, etc. as will be appreciated by those skilled in the art. In other embodiments, design tool 504 is a standalone application that only includes one or some of these modules and/or is adapted to communicate with other EDA modules.

In embodiments, system 500 can be implemented by one or more general purpose computers that are loaded with an operating system executing software and/or customized to include hardware for interactively implementing physical electronic designs and adapted with the digit pattern functionality of the present disclosure. In some embodiments, the one or more computing systems comprise various components not shown such as the processor(s) or processor core(s), memory, disks, etc. The one or more computing systems may further write to and read from a local or remote volatile or non-volatile computer accessible storage not shown that stores thereon data or information such as, but not limited to, one or more databases such as schematic design database(s) or physical design database(s), libraries, data, rule decks, constraints, etc. and/or other information or data that may be required to support the methodology of the present embodiments. In some embodiments, the one or more computing systems are implemented in a "cloud" configuration and/or a client/server configuration. For example, one or more server computers may be loaded with application software (e.g., a power and timing signoff tool) for implementing some or all of the methodology of the present embodiments, and one or more client computers can communicate with the server computer(s) via a network to perform some or all of the methodology of the embodiments for a particular design.

In general operation, a user can interact with design tool 504 via user interface module 506 and user interface devices 510 (e.g., display monitor, keyboard, mouse, etc.) to design, modify, verify etc. a portion of an IC design stored in designs 508 (e.g. designs stored in a GDS II data format). According to aspects of the present embodiments, EDA tool 500 further includes painter 512 that is adapted with the digit pattern functionality described herein. As such, using the example methodology described above, user interface module 506 interacts with painter 512 to create and use digit texture patterns and other texture patterns stored in texture patterns 514 (e.g. XBM files) to allow a user to more easily distinguish between, and identify layers of, routing strips in the IC design. It should be noted that, although shown separately for illustrating aspects of the embodiments, painter 512 may be incorporated within or together with user interface module 506.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method of interacting with a design of an integrated circuit, the method comprising:
   identifying shapes in the design for displaying in a user interface, the identified shapes including a first shape associated with a first routing strip lying in a first layer of the integrated circuit, and a second shape associated with a second routing strip lying in a second layer of the integrated circuit, wherein the first layer and the second layer are two different layers, the first shape and the second shape have a common overlapping area in the integrated circuit;
   identifying a first texture pattern and a second texture pattern associated with the first shape and the second shape, respectively, wherein the first texture pattern and the second texture pattern are different in texture pattern; and
   displaying the first shape and the second shape in the user interface using the first texture pattern and the second texture pattern, respectively, such that a display of respective identifications of the first layer and the second layer in the common overlapping area are not obscured by each other.

2. The method of claim 1, wherein the respective identifications are numerical digits corresponding to the first layer and the second layer.

3. The method of claim 2, further comprising:
   identifying a third texture pattern and a fourth texture pattern, which are different in texture pattern and associated the first shape and the second shape, respectively, wherein the third texture pattern and the fourth texture pattern are different than the first texture pattern and the second texture pattern and do not contain the numerical digits;
   determining a current zoom level of the user interface; and
   based on the determined current zoom level, displaying the first shape and the second shape in the user interface using the third texture pattern and the fourth texture pattern, respectively.

4. The method of claim 3, wherein the first shape and the second shape are displayed in a display of the user interface using the third texture pattern and the fourth texture pattern if the determined current zoom level causes a size of the first shape and the second shape in the display to exceed a threshold.

5. The method of claim 3, further comprising:
   identifying a first color and a second color which are different in color and associated with the first shape and the second shape, respectively,
   wherein the displaying further includes displaying the first shape and the second shape in the user interface using the first color and the second color, respectively.

6. The method of claim 1, further comprising generating a plurality of different texture patterns for a corresponding plurality of layers in the integrated circuit, each texture pattern of the plurality of different texture patterns containing a numerical digit respectively corresponding to the layer in the integrated circuit.

7. The method of claim 6, wherein the plurality of different texture patterns all have a common pixel height dimension and a common pixel width dimension, and wherein the generating includes causing the numerical digits in the plurality of different texture patterns to be located at respectively different pixel locations within the common pixel height dimension and the common pixel width dimension.

8. The method of claim 1, further comprising:
   identifying a first color and a second color which are different in color and associated with the first shape and the second shape, respectively,
   wherein the displaying further includes displaying the first shape and the second shape in the user interface using the first color and the second color, respectively.

9. A non-transitory computer readable storage medium having instructions stored thereon that, when executed by a computer, cause the computer to perform a method of interacting with a design of an integrated circuit, the method comprising:
   identifying shapes in the design for displaying in a user interface, the identified shapes including a first shape associated with a first routing strip lying in a first layer of the integrated circuit, and a second shape associated with a second routing strip lying in a second layer of the integrated circuit, wherein the first layer and the second layer are two different layers, the first shape and the second shape have a common overlapping area in the integrated circuit;

identifying a first texture pattern and a second texture pattern associated with the first shape and the second shape, respectively, wherein the first texture pattern and the second texture pattern are different in texture pattern; and displaying the first shape and the second shape in the user interface using the first texture pattern and the second texture pattern, respectively, such that a display of respective identifications of the first layer and the second layer in the common overlapping area are not obscured by each other.

10. The non-transitory computer readable medium of claim 9, wherein the respective identifications are numerical digits corresponding to the first layer and the second layer.

11. The non-transitory computer readable medium of claim 10, wherein the method further comprises:

identifying a third texture pattern and a fourth texture pattern, which are different in texture pattern and associated the first shape and the second shape, respectively, wherein the third texture pattern and the fourth texture pattern are different than the first texture pattern and the second texture pattern and do not contain the numerical digits;

determining a current zoom level of the user interface; and based on the determined current zoom level, displaying the first shape and the second shape in the user interface using the third texture pattern and the fourth texture pattern, respectively.

12. The non-transitory computer readable medium of claim 11, wherein the first shape and the second shape are displayed in a display of the user interface using the third texture pattern and the fourth texture pattern if the determined current zoom level causes a size of the first shape and the second shape in the display to exceed a threshold.

13. The non-transitory computer readable medium of claim 11, wherein the method further comprises:

identifying a first color and a second color which are different in color and associated with the first shape and the second shape, respectively, wherein the displaying further includes displaying the first shape and the second shape in the user interface using the first color and the second color, respectively.

14. The non-transitory computer readable medium of claim 9, wherein the method further comprises generating a plurality of different texture patterns for a corresponding plurality of layers in the integrated circuit, each texture pattern of the plurality of different texture patterns containing a numerical digit respectively corresponding to the layer in the integrated circuit.

15. The non-transitory computer readable medium of claim 14, wherein the plurality of different texture patterns all have a common pixel height dimension and a common pixel width dimension, and wherein the generating includes causing the numerical digits in the plurality of different texture patterns to be located at respectively different pixel locations within the common pixel height dimension and the common pixel width dimension.

16. The non-transitory computer readable medium of claim 9, wherein the method further comprises:

identifying a first color and a second color which are different in color and associated with the first shape and the second shape, respectively, wherein the displaying further includes displaying the first shape and the second shape in the user interface using the first color and the second color, respectively.

* * * * *